United States Patent [19]

Owens et al.

[11] Patent Number: 4,646,425

[45] Date of Patent: Mar. 3, 1987

[54] METHOD FOR MAKING A SELF-ALIGNED CMOS EPROM WHEREIN THE EPROM FLOATING GATE AND CMOS GATES ARE MADE FROM ONE POLYSILICON LAYER

[75] Inventors: Alexander H. Owens, Pennington, N.J.; Mark A. Halfacre, Horsham; David S. Pan, Doylestown, both of Pa.

[73] Assignee: Solid State Scientific, Inc., Willow Grove, Pa.

[21] Appl. No.: 680,198

[22] Filed: Dec. 10, 1984

[51] Int. Cl.[4] .................. H01L 29/78; H01L 29/02
[52] U.S. Cl. ........................ 29/571; 29/577 C; 29/576 B; 29/578; 148/1.5
[58] Field of Search ............. 29/571, 577 C, 576 B, 29/578; 148/1.5; 357/23.5, 23.14, 42

[56] References Cited

U.S. PATENT DOCUMENTS

| | | | |
|---|---|---|---|
| 4,122,544 | 10/1978 | McElroy | 365/185 |
| 4,142,926 | 3/1979 | Morgan | 148/187 |
| 4,373,249 | 2/1983 | Kosa et al. | 29/571 |
| 4,377,818 | 3/1983 | Kuo et al. | 357/23 |
| 4,422,885 | 12/1983 | Brower et al. | 29/571 |
| 4,471,373 | 9/1984 | Shimiyu et al. | 357/23.5 |

FOREIGN PATENT DOCUMENTS 133668 8/1982 Japan .................. 357/42
194565 11/1982 Japan .................. 357/23.5

OTHER PUBLICATIONS

Ghondi, VLSI Fabrication Principles, Silicon and Gallium Arsenide, John Wiley and Sons, New York, 1983, pp. 385-389.
"256Kb CMOS EPROM", by William Ip et al, ISSCC/Thursday, Feb. 23, 1984, pp. 138 and 139.
"Experimental Observation on Conduction Through Polysilicon Oxide", by H. R. Huff et al, pp. 2482 thru 2488, J. Electrochem. Soc.: Solid-State Science and Technology.

*Primary Examiner*—Brian E. Hearn
*Assistant Examiner*—John T. Callahan

[57] ABSTRACT

A CMOS EPROM is made wherein the typical EPROM device is an N-channel IGFET having a control gate self-aligned with an underlying floating gate. In this process the EPROM floating gate and the gates of both the P-channel and N-channel peripheral circuit transistors are formed from a first deposited polysilicon layer. The EPROM control gate is formed from a second deposited polysilicon layer. This CMOS EPROM process employs a surprisingly few photoresist steps and is compatible with a high temperature oxidation step for making a very high quality intergate polysilicon oxide in the EPROM devices.

14 Claims, 9 Drawing Figures

METHOD FOR MAKING A SELF-ALIGNED CMOS EPROM WHEREIN THE EPROM FLOATING GATE AND CMOS GATES ARE MADE FROM ONE POLYSILICON LAYER

BACKGROUND OF THE INVENTION

This invention relates to EPROM and semiconductor devices and the like and in particular to EPROM devices having both N-channel and P-channel peripheral devices.

Erasable programmable read only memories are well known in the semiconductor art. EPROM circuits include a matrix of EPROM devices, each of which stores a bit of information, and a plurality of peripheral transistor devices. Peripheral transistors are required for such functions as row decode and column decode of the EPROM matrix, latches and drivers.

In addition to having a control gate similar to the control gate of the peripheral devices, EPROM devices have a floating gate positioned below the control gate. It is this floating gate which allows the EPROM device to store charge, thereby programming the EPROM device. Conversely, when the EPROM device is unprogrammed, the floating gate is uncharged.

The architecture required places constraints on the size of the EPROM device. Since the floating gate must rest directly below the control gate, both gates must be large enough to allow their proper alignment. Self-alignment of both the control gate and the floating gate allows a reduction in the size of the EPROM device.

Most conventional commercial EPROM integrated circuits are NMOS wherein both the EPROM and all the peripherals are N-channel devices. The inability in practice to use P-channel transistors where their use would be beneficial has resulted in the need for a greater number of transistors (all N-channel) to perform a desired function using only N-channel transistors as well as a much larger power consumption. Peripheral circuitry could be reduced in size if both N-channel and P-channel transistors were used in the peripherals. Heretofore, no method has been known for integrating EPROM devices with both N-channel and P-channel transistors, that is capable of producing self-aligned gates in the EPROM devices.

EPROM integrated circuits are known that employ N-channel and P-channel transistors in the control circuits peripheral to the EPROM memory array which itself is usually made of N-channel memory cells. However, little has been disclosed of the integrated process steps contemplated for making such C-MOS EPROM integrated circuits.

A key factor determining quality and reliability of integrated circuits, and particularly of complex integrated circuits such as the memories under consideration here, is the number of photo-masking steps needed to make the part. This is because the minimum practical size and cost of an integrated circuit is generally limited by the resolution and registration limits of state of the art lithography. Thus for a given photo lithography, the accumulation of masking steps should be kept to the barest minimum to render a process practical.

It is therefore an object of this invention to provide a CMOS EPROM integrated circuit wherein both the floating gate and the control gate are self-aligned.

It is a further object of this invention to provide a process for making such an integrated circuit requiring a relatively small number of photo lithographic masking steps.

It is a further object of this invention to provide in such a CMOS EPROM integrated circuit a very high quality insulation between the floating gate and the control gate of each elemental EPROM device.

SUMMARY OF THE INVENTION

A method is provided for fabricating a self-aligned N-channel EPROM and an N-channel and a P-channel transistor in a P-conductivity type substrate. A first polysilicon layer is formed over the regions of the substrate on which there will be formed the EPROM device, the P-channel device and the N-channel device, respectively. A high quality oxide layer is grown over the portion of the first polysilicon layer that overlies the EPROM device. A second polysilicon layer is formed over the portion of the high quality insulating layer that overlies the EPROM device region. A mask is formed over a central part of the second polysilicon layer overlying the EPROM device region.

The first and second polysilicon layers are removed from the portion of the EPROM device region adjacent to but not covered by the mask to form self-aligned floating and control gates. The gates of the transistors are formed by removing portions of the first polysilicon layer that are peripheral to a central region over each of the N-channel and P-channel device regions, respectively, to form a polysilicon gate over each of the N-channel and P-channel device regions.

An EPROM array may thus be formed by using a plurality of such EPROM devices while the memory control circuits may be formed using power efficient C-MOS circuits that employ a plurality of such N-channel and P-channel devices.

A high temperature oxidation step may be employed to form the intergate oxide in the EPROM, in which step the silicon wafer is heated to 1100° C. in oxygen for half an hour. Alternatively, our experiments provide evidence that even better results may be obtained by heating the substrate to between 1100° C. and 1180° C., a range for growing oxides in an integrated circuit that is unheard of. Our experimental evidence also surprisingly shows that the capability for this high quality intergate oxide to stop charge from leaking through it from the EPROM floating gate to the control gate will be an insignificant function of the intergate oxide thickness down to 450 Å and possibly thinner.

The process of this invention, wherein the EPROM floating gate and the N-channel and P-channel gates are all formed from the first polysilicon layer is uniquely suited for forming the high quality EPROM intergate polysilicon oxide by a high temperature step, because at that step the doped N- and P-channels must be covered by their gate oxides preventing auto-doping from the doped channels into the growing intergate oxide.

The process of this invention represents a unique selection and combination of a surprisingly few process steps to make C-MOS EPROM. For example, the number of photoresist masking steps in the preferred embodiment described herein, through defining metal conducting paths, is only nine, whereas at least nine photo masking steps are required to make known NMOS EPROM integrated circuits having no P-channel devices. Furthermore, in the process of this invention an advantageous secondary phosphorous doping of EPROM and N-channel device gates and drains is easily integratable and compatible; and the above-noted advantageous high temperature intergate oxide growing step is also compatible. Both additional process improvements may be integrated into the basic process with no additional photoresist steps needed.

DESCRIPTION OF THE PREFERRED EMBODIMENTS

Figure 1:
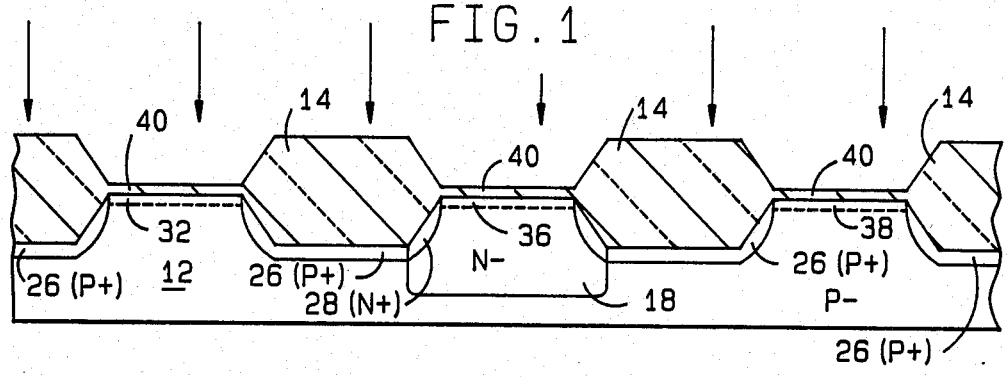
FIGS. 1 to 9 illustrate inside-sectional views fabricating a self-aligned CMOS EPROM of the present invention. These figures are not to scale especially owing to the vertical dimensions being magnified relative to the horizontal dimensions.

In the process of this invention, certain early steps are executed that provide a structure illustrated in FIG. 1. These early steps are described and illustrated in detail in the copending application Ser. No. 680,197 filed simultaneously herewith. A brief description of those early steps follows.

A P-type substrate 12 upon which a self-aligned EPROM and both P-channel and N-channel peripheral transistors are to be formed is covered with a silicon dioxide layer that is formed by exposing substrate 12 to a high temperature in the presence of oxygen. After this initial oxidation, a conventional photoresist etch is performed In this etching step, a layer of photoresist is used to selectively etch the oxide layer creating an aperture in the oxide layer.

This is followed by an N-well ion implant wherein N-type ions such as phosphorous ions bombard the entire substrate surface. However, only the region of substrate 12 beneath the oxide aperture receives these N-type ions causing a predetermined concentration of impurities in region 18.

Following the N-type implant, photoresist layer is stripped, and an N-well diffusion is performed. In this step, the substrate is raised to a high temperature, approximately 1200°. This high temperature causes the N-type dopant to migrate forming an N-well 18 in FIG. 1. Before the diffusion, well 18 had a depth of approximately a few thousand angstroms. After the diffusion, it has a depth of approximately 30,000 angstroms. This creates the N-well in which the P-channel transistor is built.

During the high temperature diffusion process, the silicon dioxide layer 14 grows several hundred angstroms because of further oxidation. An extension of oxide layer 14 above well 18 is also formed for the same reason.

Silicon nitride is then deposited on the surface of oxide layer 14 forming a nitride layer that is then etched through a photoresist masking layer to mask all the regions where a device is to be built, whether the device is an EPROM device, a P-channel transistor, or an N-channel transistor. This etching removes the regions of the silicon nitride layer not covered by the mask.

Following the nitride etch, P+ guard rings 26 are formed by a blanket boron implant.

After the formation of guard rings 26 the photoresist masking layer is removed and a new photoresist masking layer is provided which is used with the remaining patches of the nitride layer as masks to a phosphorous ion implant to create N+ guard ring 28 with N-well 18.

The photoresist layer is then removed and a field oxidation is performed during which the substrate is subjected to a high temperature for a long period of time causing oxide layer 14 to become greatly enlarged as shown in FIG. 1. The regions of oxide layer 14 beneath the remaining patches of the nitride layer are not affected except for regions right at the edges of the nitride layer. The remaining patches of the nitride layer are then removed and the resulting structure is as shown in FIG. 1.

The removal of the nitride layer patches is followed by a blanket channel implant with a P-conductivity type impurity atoms such as boron as is illustrated in FIG. 1. In this implant, the threshold of all three devices are adjusted. Channel regions 32 and 38 which are the regions where the EPROM channel will be formed, and where the N-channel transistor device will be formed, respectively, are doped to achieve the desired thresholds in this step. The regions under the enlarged oxide layer 14 are, of course, not affected by this implant. The enlarged regions of oxide layer 14 are too thick for the implant to penetrate.

Region 36, which is the channel region of the P-channel transistor, also receives P-type implants during this step. The region 36 was doped independently in an earlier step, at which time the doping of N-well was performed. During that independent doping of region 18, the boron implant shown was considered in advance and compensated for.

Silicon dioxide region 40 covers the area of substrate 12 above region 32 in which the EPROM will be formed, above the region 36 in which the P-channel device will be formed and above the region 38 in which the N-channel device will be formed. The ultimate thickness of the oxide at these locations will also determine the threshold of the EPROM and the N-channel and P-channel devices. However, the thickness of region 40 was not precisely controlled. It is the result of several intermediate oxidation steps. Region 40 is therefore etched and channel regions 32, 36 and 38 are exposed.

Figure 2:
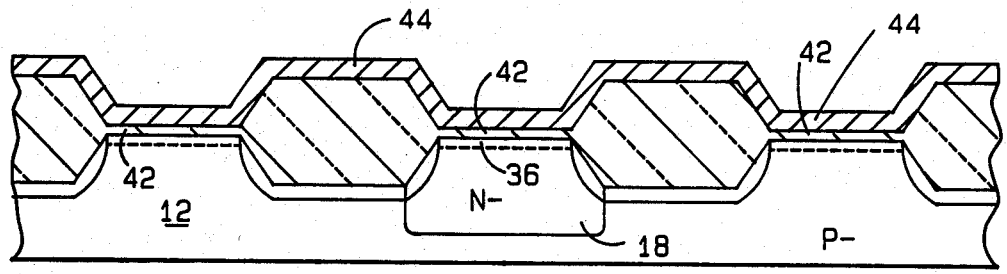

FIG. 2 shows an oxide layer 42 in the same location from which oxide layer 40 was removed. Oxide layer 42 is grown at these locations in a gates-oxidation step at 950° C. in 10% steam under very precise and controlled conditions. Oxide layer 42 is one of the key elements that determine the reliabilty of the devices.

The oxidation to form layer 42 is followed by deposition of a layer of polysilicon 44. Polysilicon layer 44 is formed of conventional polycrystalline silicon which is deposited in a conventional vapor depositing step. Polysilicon layer 44 may be doped with N+ type ions to make it more conductive. This may be accomplished by a standard phosphorous diffusion step, known as $POCl_3$ doping to impart conductivity to the polysilicon layer 44 amounting to about 15 ohms per square.

A photoresist masking layer 48 is formed over the area of the entire EPROM device, and in the direction of drain to source just over a central area of each of the P-channel and N-channel devices to define the gates of the P-channel and N-channel devices. This is followed by a silicon etch to selectively remove portions of polysilicon layer 44. Thus, a remaining portion of 44a of etched polysilicon layer 44 and the polysilicon gates 44b and 44c of the P-channel and N-channel devices are at this point in the process as is shown in FIG. 3.

Figure 4:
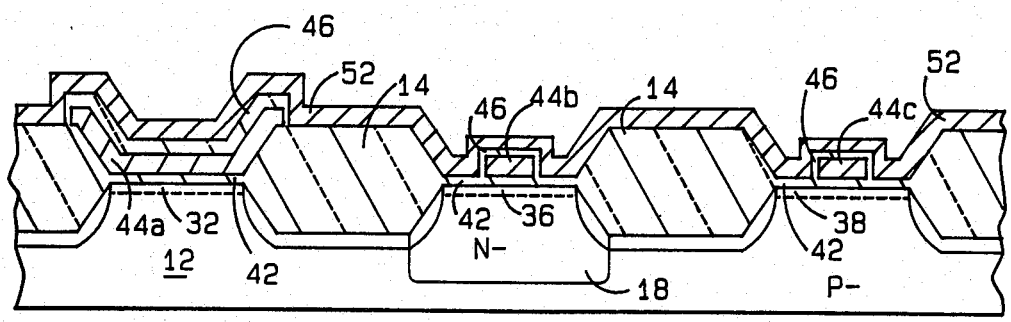

The photoresist layer 48 is then stripped away and polysilicon regions 44a, 44b and 44c are oxidized to form the silicon oxide layer 46 as shown in FIG. 4.

In the EPROM device being formed at channel region 32, the quality of the polysilicon oxide 46, grown over the polysilicon layer 44 which will become the floating gate, is a key factor determining memory retention time. It has been discovered that to grow this polysilicon dioxide layer 46 at a temperature of 1100° C. and preferably greater than 1100° C. for about 30 minutes produces a strikingly superior quality of polysilicon oxide.

Figure 3:
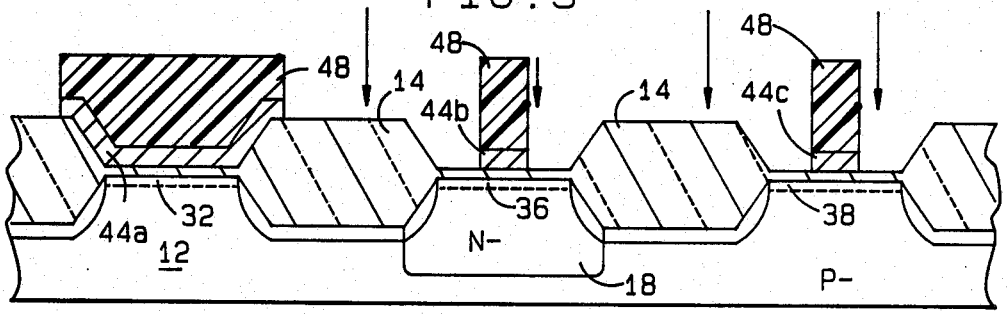

Referring to FIG. 3, it will be seen that just prior to this high temperature oxidation step, the gate oxide 42 has previously been formed over the channels of all devices which serves to prevent auto-doping and degrading the high quality intergate oxide 46 from the doped exposed channel regions. If one attempts to form by this high temperature step the EPROM intergate oxide and the N-channel and P-channel oxides, auto-doping would defeat the high quality oxide goal.

In the process for building prototype CMOS EPROM integrated circuits according to this invention, the polysilicon oxide layer 46 was grown at 1100° C. for 30 minutes in a nitrogen atmosphere containing about 5% oxygen. The thickness of the polysilicon oxide layer 46 was about 700 Å. The rate of oxidation, and thus the rate of growth of the polysilicon oxide, is finely controlled by varying the percentage of oxygen in the atmosphere.

In operation, the EPROM device, with no charge on the floating gate 44a' is capable of becoming conductive, and is said to store a "zero" when the control gate 52a is made positive by a few volts, e.g., 5 volts. The floating gate 44a' may be charged negatively by avalanche currents from the drain to which a large positive voltage, e.g., about 15 volts, has been applied. Having been so programmed, the EPROM device is said to store a "one" and in this state the threshold voltage is now much greater, e.g., greater than +5 volts and preferably about +10 volts.

The major benefit of the high temperature polysilicon oxidation step is to provide an intergate insulation layer of higher leakage resistance. Accelerated life tests conducted at high temperatures and high voltages are underway and indicate that reliable memory retention will extend to many years.

In a series of experimental groups of six each EPROM integrated circuits, the temperature at which the groups were heated for forming the inter-gate oxide layer 46a was varied from 900° C. to 1100° C. A measure of the time that the EPROM devices in each group are capable of maintaining their stored charge was obtained by charging (programming) the floating gates, measuring the threshold voltage (at which the control gate must be raised to cause conduction between source and drain), applying for over one second (1.6 sec) 15 volts to the gate with source and drain grounded to stress the intergate oxide 46a, and finally remeasuring the threshold voltage. The quality of the intergate oxide is inversely related to the amount by which the threshold in this stress test is caused to decrease. The quality of this intergate oxide progressively improves almost independently of the intergate oxide thickness as the oxidation temperature is raised from 900° C. to 1100° C., and it is expected to improve further over 1100° C. However, no higher oxidation temperature than about 1180° C. should be used since at such high temperatures the predetermination of channel dopant parameters to produce predictable threshold voltages becomes intolerably difficult.

A second layer of polycrystalline silicon is deposited upon the substrate forming polysilicon layer 52. Polysilicon layer 52 has a very high resistance. In order to make it highly electrically conductive, polycrystalline layer 52 is doped with N-type dopant, thereby creating an N+ polycrystalline layer 52.

Figure 5:
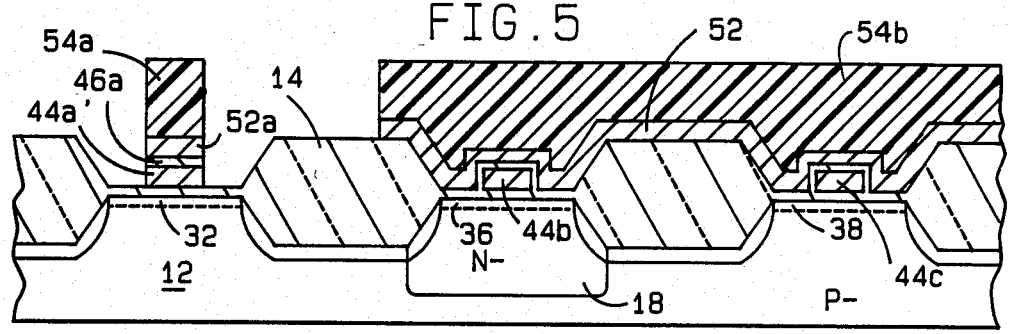

Referring now to FIG. 5, the critical EPROM gate etches are performed. It is these etches which produce the self-aligned gate structure which allows a reduction in size of the EPROM matrix of the CMOS circuit. During these EPROM gate etches, a photoresist layer 54b covers the peripheral devices gate regions, namely both P-channel transistor region 36 and N-channel transistor region 38. Photoresist 54a covers a portion of N+ polysilicon layer 52a above EPROM channel region 32.

The first etch is an N+ polysilicon etch which removes N+ polysilicon layer 52 exposed by the mask layers 54a and 54b except for the portion below photoresist layer 54a. The second etch is a buffered-hydrofluoric polycrystalline-oxide etch which removes polycrystalline oxide layer 46 except for the portion below photoresist layer 54a. The final etch is a polysilicon etch which removes polysilicon layer 44a except for the portion 44a below photoresist layer 54a.

The structures below photoresist layer 54a are EPROM control gate 52a which is formed from N+ polysilicon layer 52, interpoly oxide layer 46a which is formed from polysilicon oxide layer 46, and floating gate 44a' which is formed from polysilicon layer 44. By using the single photoresist layer 54a and performing the series of etches described, perfect self-alignment of both gate structures 52a and 44a' is assured since floating gate 44a', control gate 52a, and oxide layer 46a betweem them are forced to have the position and dimensions determined by photoresist 54a. The self-alignment of the two EPROM gate structures allows reduction in EPROM size.

Figure 6:
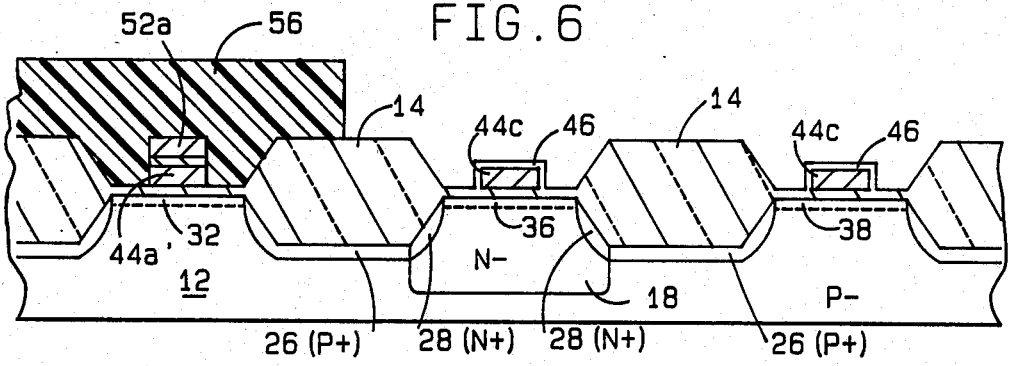

Referring now to FIG. 6, following the series of etches to form the EPROM gate structures, photoresist layers 54a and 54b are stripped and photoresist layer 56 is formed to cover the EPROM region 32, leaving open the polysilicon layer 44b above P-channel region 36 and the polysilicon layer 44c above the N-channel region 38.

A polysilicon etch is then performed removing polysilicon layer portion 52 over the N- and P-channel regions, and not the portion 52a below photoresist layer 56. The photoresist layer 56 is then removed and a polysilicon oxidation step is performed. This oxidation step results in the formation of the polysilicon oxide layer 62 on the EPROM gate structure shown in FIG. 7. and also adds thickness to the oxide layer 46 that covers P-channel gate 44b and N-channel gate 44c.

Photoresist masking layer 64 is deposited and an aperture is formed in layer 64 above N-well 18 where the P-channel transistor is to be formed. A p-type ion implant is performed with masking layer 64 preventing ions from being implanted in the N-channel transistor region 38 and in the EPROM device channel region 32. P-channel gate 44b, along with its oxide layer 46, prevent p-type ions from entering channel region 36 underneath them. The enlarged regions of oxide layer 14 prevent the p-type ions from being implanted in N+ guard rings 28. The result is the formation of P+ regions 66. P+ regions 66 are the source and drain regions of the P-channel transistor.

Figure 8:
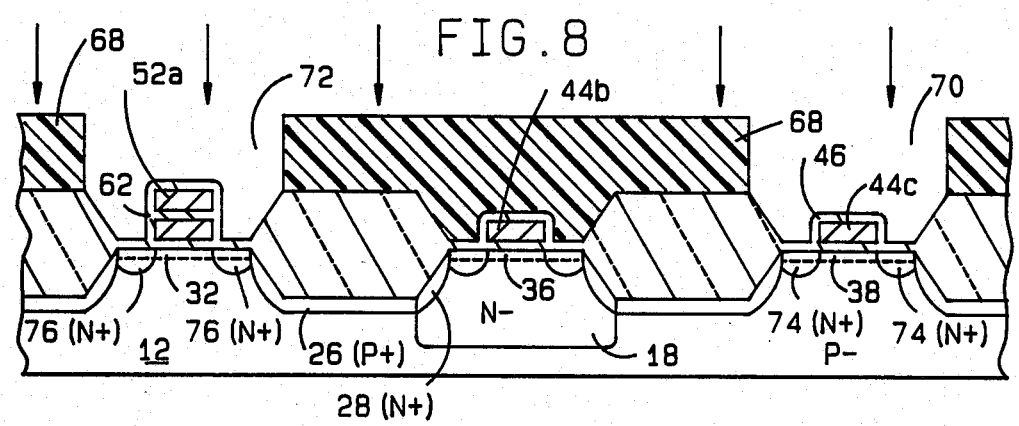

Referring now to FIG. 8, the source and drain regions of the EPROM and the N-channel transistor are formed. Photoresist layer 64 is stripped and a new photoresist layer 68 is formed. Photoresist layer 68 has aperture 70 above the region where the N-channel transistor is to be formed and aperture 72 above the region where the EPROM device is to be formed. Following the formation of apertures 70 and 72 in layer 68, N-type arsenic ions are implanted. N-channel transistor gate 44c and its oxide layer 46 protect a portion of N-channel region 38 from receiving the ion implants. This results in the formation of N+ source and drain regions 74 which provides gate-aligned channels 32 and 38.

In a similar manner, control gate 52a and floating gate 44a protect a portion of N-channel region 32 and EPROM thereby causing the ion implant to form N+ source and drain regions 76. Thus, the source and drain regions 76 of the N-channel EPROM device and 74 of the N-channel transistor are formed simultaneously, and are called self-aligned N+ sources and drains.

Figure 7:
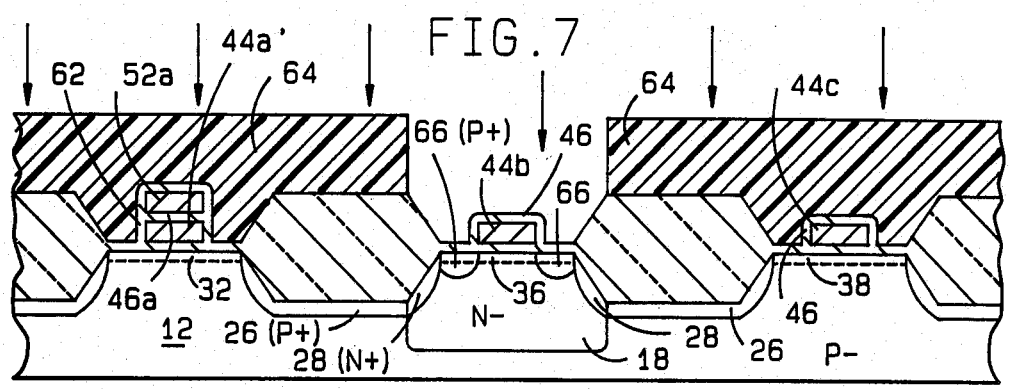

The two procedures described above for forming the source/drain regions of the P-channel and N-channel devices, respectively, that are illustrated in FIGS. 7 and 8, respectively, may be performed in the reverse order.

It is preferred, but not essential, that after the implantation of arsenic for forming drains and sources of the N-channel transistor device and EPROM device, to implant phosphorous which is also an N-type dopant, through the same apertures 70 and 72 of the photoresist mask 68.

Figure 9:
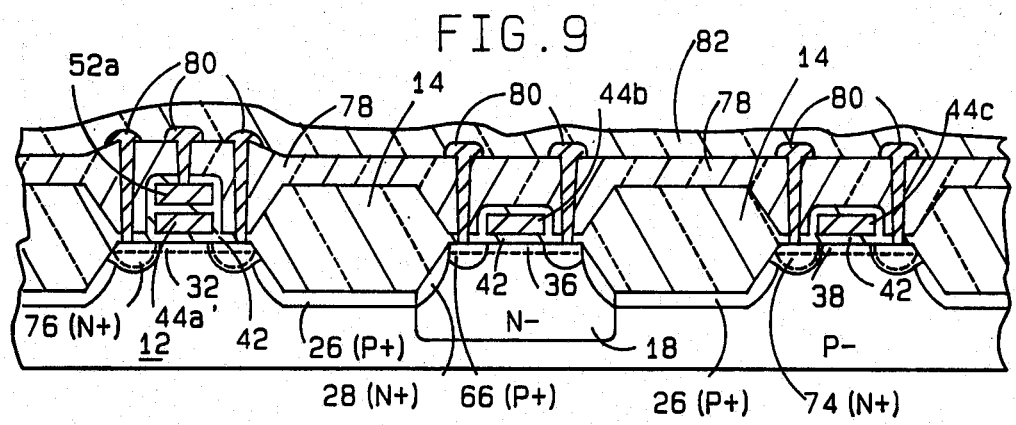

Since phosphorous has a greater diffusion rate than arsenic, the subsequent heating steps after the double doping results in the phosphorous outrunning the arsenic and spreading each of the sources and drains downward and to both the left and right as indicated in FIG. 9.

One object of this second doping is to create an EPROM drain of a high density core of arsenic ions for making good ohmic contact thereto and to form around this core a low density N-type shell of phosphorous ions that extend under the EPROM floating gate 44a' to effect an improved EPROM programming efficiency. This feature is more fully explained in our application Ser. No. 680,199 entitled Method for Double Doping Sources and Drains In An EPROM that is filed simultaneously herewith.

A second object of this second doping is to reduce the drain to body leakage and to reduce the chances of a short between the metal 80 and drain 74 and/or 76 at the silicon surface under the "birds beak" field region between the P+ stops 26 and the only-arsenic doped drains 74 and 76 as seen in FIG. 8. Such an undesirable leakage or short condition may be brought about by a slight misregistration between the metal contacts 80 and the EPROM and N-channel devices.

The improvement in programming efficiency is accomplished by the phosphorous drain extension under the floating electrode 44a' and it is therefore only necessary to apply the second phosphorous doping to the drains, and not the sources, of the EPROM device.

However, to achieve the reduced likelihood of shorting between both the sources and drains of the EPROM and N-channel devices, the secondary doping (with phosphorous) is also applied to the sources. A further advantage of phosphorous doping to both the sources and drains is that no additional photomask is required. The phosphorous implant is done using the same mask 68 as was used for the arsenic implant.

Referring now to FIG. 9, a contact etching step is performed. In this step, glass is deposited on the surface and heated until it reflows slightly, thereby forming reflow glass layer 78. Photoresist is then deposited and contact holes are cut to all source, drain and gate regions. The photoresist is then removed.

A metal alloy is then deposited. This metal alloy comes in contact with the areas beneath the apertures which have been etched in glass layer 78, thereby forming metal contacts 80. This is followed by a metal photoresist masking and a metal etch which leaves metal above the regions to which contact is required. A passivation layer 82 is then deposited and etched, resulting in the final structure as shown in FIG. 9.

The above noted prototypes were subjected to tests for breakdown of the inter-gate polysilicon oxide layer 44a' and were found to withstand about 6 MV/cm (6 million volts per centimeter of thickness). It is not known what mechanism or mechanisms are responsible for the almost doubling of the polysilicon breakdown voltages when the oxidation temperature is simply increased above 1100° C. However, it is hypothesized that the parent polysilicon layer 46a has its surface smoothed by reflowing at the higher temperatures which eliminates points of high field concentration.

What is claimed is:

1. A method of fabricating on a P-conductivity type substrate at least one each of an EPROM device having self-aligned floating and control gates, a P-channel transistor device, and an N-channel transistor device comprising the steps of:
   (a) forming an N-well in said substrate encompassing a region in which said P-channel device is to be formed and implanting P-type impurity atoms in regions of said substrate at which said EPROM, P-channel and N-channel devices, respectively, are to be formed to simultaneously introduce the last impurities that will determine the threshold voltages, respectively, of each of said three devices;
   (b) forming a first polysilicon layer over said substrate without intervening doping steps after said implanting;
   (c) oxidizing the outer surface of said first polysilicon layer to grow a polysilicon oxide insulating layer thereover;
   (d) removing initial portions of said first polysilicon layer to leave one remaining portion over said EPROM region, and two other remaining portions that occupy a central region over each of said N-channel and P-channel device regions, respectively, to form the gates of said N-channel and P-channel devices;
   (e) forming a second polysilicon layer over said insulating layer and said EPROM device region; and
   (f) forming an EPROM-gates masking layer over said second polysilicon layer and a central part of said EPROM region, and removing the adjacent exposed portions of said first and second polysilicon layers not covered by said EPROM-gates masking layer to form said EPROM self-aligned gates.

2. The method of claim 1 wherein said oxidizing said first polysilicon layer is accomplished by heating said substrate to a temperature of from 1100° C. to 1180° C. in a dry oxygen atmosphere to produce a high quality polysilicon oxide insulating layer.

3. The method of claim 2 wherein said heating is in a gas mixture comprised of an inert gas and oxygen.

4. The method of claim 3 wherein said oxygen amounts to about 5 percent of said mixture by volume.

5. The method of claim 3 additionally comprising changing the percentage of oxygen in said mixture to adjust the thickness of said high quality polysilicon-oxide insulating layer.

6. The method of claim 2 wherein said high quality insulating layer is a polysilicon oxide layer having a thickness of less than 1000 angstroms.

7. The method of claim 6 wherein said high quality insulating layer has a thickness of 700 angstroms or less.

8. The method of claim 1 wherein said removing portions of said first polysilicon layer is accomplished by selectively forming a CMOS-gates masking layer over a central part of said P-channel region, over a central part of said N-channel region and over the entire of said EPROM region, and etching to remove portions of said first polysilicon layer that are adjacent to said central portions of said CMOS-gates masking layer to form the gates of said P-channel and said N-channel devices.

9. The method of claim 8 additionally comprising removing said CMOS-gates masking layer before said oxidizing, and wherein said forming said second polysilicon layer is a blanket polysilicon deposition over said substrate and is to additionally cover and overlie said polysilicon oxide insulating layer overlying said P-channel and N-channel gates, said blanket deposition of said second polysilicon layer being accomplished after said oxidizing step.

10. The method of claim 1 additionally comprising, after said oxidizing and before forming said EPROM-gates masking layer, forming an EPROM-region-protective masking layer over said EPROM region but not over said P-channel and N-channel regions, and etching to remove said second polysilicon layer portions lying exposed and outside said EPROM-protective masking layer.

11. The method of claim 1 additionally comprising heating to oxidize said self-aligned EPROM gates and to further oxidize said P-channel and N-channel gates.

12. The method of claim 11 additionally comprising forming an ion-implant masking layer covering said EPROM and said N-channel regions, and exposing said P-channel region; and implanting P-type ions to form the source and drain of said P-channel device wherein said P-channel gate serves also as an implant mask and determines the channel length of said P-channel device.

13. The method of claim 11 additionally comprises forming an ion-implant masking layer covering said P-channel region and exposing said EPROM and N-channel regions; and implanting N-type arsenic ions to form the sources and drains of said EPROM device and of said N-channel device, respectively, wherein said self-aligned gates serve also as an implant mask and at least partially determines the channel length of said EPROM device, and wherein said N-channel gate also serves as an implant mask and determines the channel length of said N-channel device.

14. The method of claim 13 additionally comprising implanting phosphorous ions through said implant mask.

* * * * *